(12) United States Patent
van Waasen

(10) Patent No.: US 7,853,212 B2
(45) Date of Patent: Dec. 14, 2010

(54) MULTI-MODE MODULATOR

(75) Inventor: Stefan van Waasen, Kolbermoor (DE)

(73) Assignee: Infineon Technologies AG, Munich (DE)

( * ) Notice: Subject to any disclaimer, the term of this patent is extended or adjusted under 35 U.S.C. 154(b) by 764 days.

(21) Appl. No.: 11/766,558

(22) Filed: Jun. 21, 2007

(65) Prior Publication Data

US 2008/0318620 A1 Dec. 25, 2008

(51) Int. Cl.
*H04B 7/00* (2006.01)
*H04B 1/66* (2006.01)

(52) U.S. Cl. .................. 455/42; 455/102; 455/108

(58) Field of Classification Search ............ 455/42, 455/102, 108, 127.4, 91, 61; 375/295, 300, 375/298
See application file for complete search history.

(56) References Cited

U.S. PATENT DOCUMENTS

| | | | |
|---|---|---|---|
| 5,945,885 A | 8/1999 | Schwartz et al. | |
| 6,069,537 A | 5/2000 | Kim et al. | |
| 6,535,561 B2 | 3/2003 | Boesch et al. | |
| 6,834,084 B2 * | 12/2004 | Hietala | 375/296 |
| 6,853,836 B2 | 2/2005 | Asam et al. | |
| 6,906,996 B2 * | 6/2005 | Ballantyne | 370/204 |
| 7,180,384 B2 | 2/2007 | Efstathiou et al. | |
| 7,183,844 B2 | 2/2007 | Klomsdorf et al. | |
| 7,376,180 B2 * | 5/2008 | Feher | 375/232 |
| 7,599,448 B2 * | 10/2009 | Ahmed et al. | 375/300 |
| 7,609,779 B2 * | 10/2009 | Wagh et al. | 375/295 |
| 2004/0114564 A1 | 6/2004 | Gersemsky et al. | |
| 2005/0275481 A1 | 12/2005 | Grewing et al. | |
| 2006/0038710 A1 | 2/2006 | Staszewski et al. | |
| 2007/0030116 A1 | 2/2007 | Feher | |

OTHER PUBLICATIONS

Z. Skrba and T. J. Brazil, "System Level Modelling of Wireless Communication Systems Using a Power Amplifier Behavioural Model," Joint IEI/IEE Symposium on Telecommunications System Research; Nov. 27, 2001; 7 pgs.
I. Croxford and C. Marsden, "Re:Think! Wireless LAN Regulation and Standards in Europe," www.re-think.com; Sep. 2002; 46 pgs.
Agilent Technologies, "Control Loop Design for GSM Mobile Phone Applications," www.agilent.com/semiconductors; May 27, 2003; 11 pgs.
Texas Instruments, "The Effects of Adjacent Channel Rejection and Adjacent Channel Interference on 802.11 WLAN Performance," Nov. 2003; 18 pgs.
E.W. McCune, June, Tropian Inc., "Multi-Mode and Multi-Band Polar Transmitter for GSM, NADC, and EDGE," IEEE 2003; pp. 812-815.
J. Wojtiuk, "Bluetooth and WiFi Integration: Solving Co-Existence Challeges," www.rfdesign.com; Oct. 2004; pp. 20-26.

(Continued)

*Primary Examiner*—Sonny Trinh
(74) *Attorney, Agent, or Firm*—Dicke, Billig & Czaja, PLLC

(57) ABSTRACT

A multi-mode modulator includes a first data path to process in-phase signals in a quadrature modulation mode, a second data path to process quadrature signals during the quadrature modulation mode, and a first multiplexer to selectively switch polar amplitude data onto one of the first and second data paths in response to a selection signal.

32 Claims, 2 Drawing Sheets

OTHER PUBLICATIONS

J. Chou, "Reducing the Design Complexity of Next-Generation Handsets," www.rfdesign.com; Sep. 2006; pp. 28-32.

Wirelesseurope magazine, "Mobile VoIP Collides with Cellular," Aug./Sep. 2006, Issue 46; 28 pgs.

R. Fan article entitled "CMOS Transceiver Key Component for Next-Gen Cellphones," Mar. 2005; 3 pgs.

W.B. Sander, S.V. Schell, and B.L. Sander, "Polar Modulator for Multi-Mode Cell Phones," pre-Jun. 21, 2007 (actual publication date not listed); 7 pgs.

Anixter manual entitled, "Wireless Mobility Solutions Application Guide—A Guide to Solutions, Standards & Applications," pre-Jun. 21, 2007 (actual publication date not listed); 20 pgs.

* cited by examiner

MULTI-MODE MODULATOR

BACKGROUND

There is a steadily increasing number of wireless systems and applications. It is desirable in these systems to have highly efficient transceiver structures, which can be used for multimode purposes, such as GSM/UMTS (Global System for Mobile communications/Universal Mobile Telecommunications System). In addition, WLAN and Bluetooth are being provided as applications in mobile phones, and are being provided together on the same silicon in so called "combo" solutions. "WLAN", as used herein, refers to a wireless local area network, such as a network meeting the IEEE 802.11b (i.e., "Wi-Fi") or IEEE 802.11g standard. Bluetooth is mainly directed towards low-power, short-range applications, and WLAN typically provides greater range and bandwidth, but higher power consumption. WLAN and Bluetooth operate in the same 2.4 GHz ISM (Industrial-Scientific-Medical) frequency band. This makes it possible to share front-end components (e.g., antenna, power amplifier, switch, filter, etc.) between the WLAN and Bluetooth applications.

In a device having a combination of WLAN and Bluetooth applications, there may be a limited number of operation scenarios. For example, both applications may not be able to transmit at the same time, and one application may not be able to receive while the other application is transmitting. Allowed operation scenarios include transmitting with one application at a time, and both applications receiving at the same time. These operation scenarios make it possible to share main parts of the transmitter for both applications.

Devices that provide WLAN capabilities typically use an IQ (In-phase-Quadrature) modulator structure for the WLAN communications. An IQ modulator is also referred to as a quadrature modulator. Devices that provide Bluetooth capabilities typically use a polar modulator for the Bluetooth communications. For devices having a combination of WLAN and Bluetooth applications, a conventional IQ modulator is typically modified or reconfigured to support both applications. However, using a pure IQ modulator for both applications is not an optimum solution as it is more appropriate for a broader band system, such as WLAN, rather than a narrower band system, such as Bluetooth.

For these and other reasons, there is a need for the present invention.

SUMMARY

One embodiment provides a multi-mode modulator. The modulator includes a first data path to process in-phase signals in a quadrature modulation mode, a second data path to process quadrature signals during the quadrature modulation mode, and a first multiplexer to selectively switch polar amplitude data onto one of the first and second data paths in response to a selection signal.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
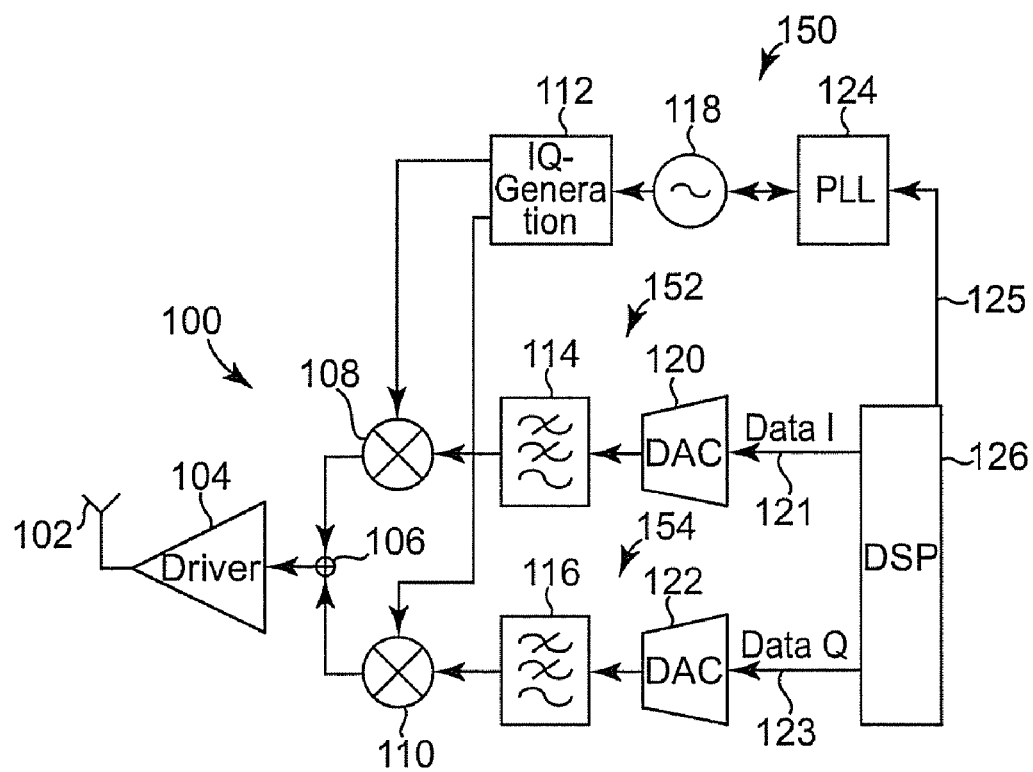
FIG. 1 is a block diagram illustrating a known IQ modulation transmitter.

FIG. 1 is a block diagram illustrating a known IQ modulation (quadrature modulation) transmitter 100. Devices that provide WLAN capabilities typically use an IQ modulation transmitter, such as that shown in FIG. 1. IQ modulation transmitter 100 includes antenna 102, driver 104, combiner 106, mixers 108 and 110, IQ generation unit 112, anti-aliasing filters 114 and 116, radio frequency voltage-controlled oscillator (RF VCO) 118, digital-to-analog converters (DACs) 120 and 122, phase locked loop (PLL) 124, and digital signal processor (DSP) 126. Transmitter 100 includes three data paths 150, 152, and 154. The first data path 150 includes PLL 124, RF VCO 118, and IQ generation unit 112. The second data path 152 includes DAC 120, filter 114, and mixer 108. The third data path 154 includes DAC 122, filter 116, and mixer 110.

DSP 126 provides digital in-phase data (Data I) 121 to DAC 120, and digital quadrature data (Data Q) 123 to DAC 122. The digital in-phase data 121 and digital quadrature data 123 are referred to as IQ components or quadrature components. The IQ components are orthogonal to one another and form a complex signal.

DAC 120 converts the received digital in-phase data 121 to analog in-phase signals, and outputs the analog signals to filter 114. DAC 122 converts the received digital quadrature data 123 to analog quadrature signals, and outputs the analog signals to filter 116. Filter 114 filters the received analog in-phase signals and outputs filtered analog in-phase signals to mixer 108. Filter 116 filters the received analog quadrature signals and outputs filtered analog quadrature signals to mixer 110.

DSP 126 outputs channel selection data 125 to PLL 124. PLL 124 controls the transmission frequency based on the channel selection data 125 received from DSP 126. PLL 124 causes RF VCO 118 to generate an appropriate analog radio frequency carrier signal corresponding to the selected channel indicated by channel selection data 125. The analog radio frequency carrier signal is output from RF VCO 118 to IQ generation unit 112, which provides an in-phase radio frequency carrier signal to mixer 108 and a quadrature radio frequency carrier signal to mixer 110.

Mixer 108 mixes the in-phase radio frequency carrier signal received from IQ generation unit 112 with the filtered analog in-phase signals received from filter 114, and outputs a mixed signal to combiner 106. Mixer 110 mixes the quadrature radio frequency carrier signal received from IQ generation unit 112 with the filtered analog quadrature signals received from filter 116, and outputs a mixed signal to combiner 106. Combiner 106 combines the two mixed signals received from mixers 108 and 110, and outputs a combined signal to driver 104. Driver 104 drives the combined signal onto antenna 102, thereby causing the combined signal to be wirelessly transmitted.

Figure 2:
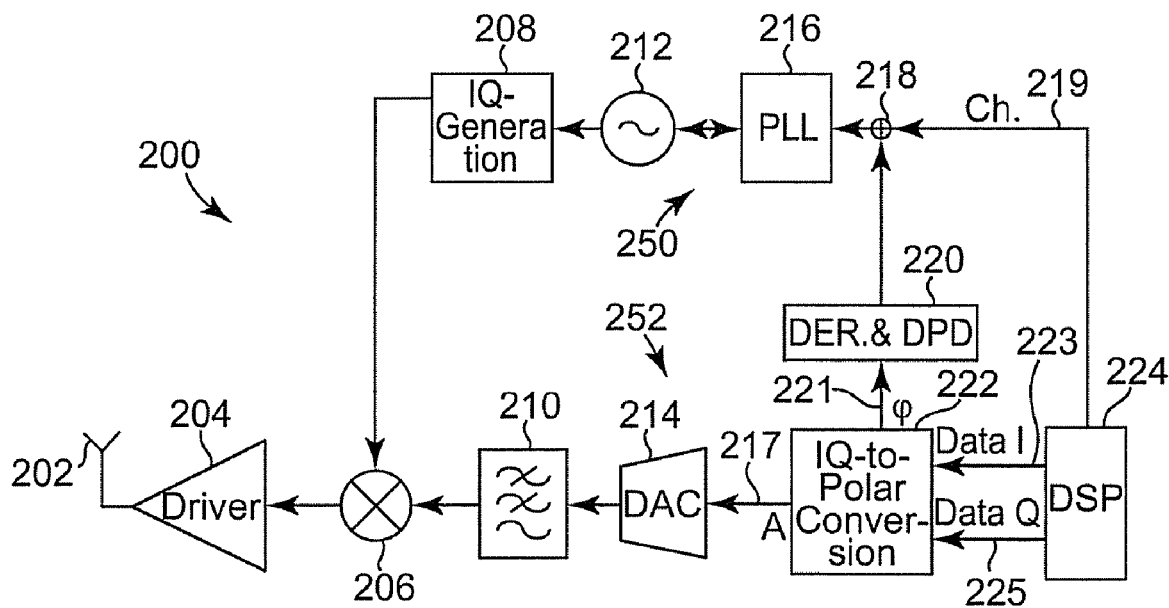
FIG. 2 is a block diagram illustrating a known polar modulation transmitter.

FIG. 2 is a block diagram illustrating a known polar modulation transmitter 200. Devices that provide Bluetooth capabilities typically use a polar modulation transmitter, such as that shown in FIG. 2. Polar modulation transmitter 200 includes antenna 202, driver 204, mixer 206, IQ generation unit 208, anti-aliasing filter 210, radio frequency voltage-controlled oscillator (RF VCO) 212, digital-to-analog converter (DAC) 214, phase locked loop (PLL) 216, combiner 218, derivative and digital pre-distortion circuit (DER. & DPD) 220, IQ-to-Polar converter 222, and digital signal processor (DSP) 224. Transmitter 200 includes two data paths 250 and 252. The first data path 250 includes PLL 216, RF VCO 212, and IQ generation unit 208. The second data path 252 includes DAC 214, filter 210, and mixer 206.

DSP 224 provides digital in-phase data (Data I) 223 and digital quadrature data (Data Q) 225 to IQ-to-Polar converter 222. IQ-to-Polar converter 222 converts the received IQ data 223 and 225 to corresponding polar coordinate data, which includes an amplitude component (A) and a phase component (φ). IQ-to-Polar converter 222 outputs the digital amplitude data (A) 217 to DAC 214. DAC 214 converts the received digital amplitude data 217 to corresponding analog signals, and outputs the analog signals to filter 210. Filter 210 filters the received analog signals and outputs filtered analog signals to mixer 206.

IQ-to-Polar converter 222 outputs digital phase data (φ) 221 to derivative and digital pre-distortion circuit 220. Circuit 220 performs a derivative function on the received phase data to generate phase difference data (i.e., phase difference between sample clocks, which is equivalent to frequency since frequency equals dφ/dt). Circuit 220 also performs a pre-distortion operation on the received data to compensate for bandwidth limitations of the PLL 216. Circuit 220 outputs the phase difference data to combiner 218. Combiner 218 also receives channel selection data 219 from DSP 224. Combiner 218 combines the channel selection data received from DSP 224 and the phase difference data received from circuit 220, and outputs the combined signal to PLL 216.

PLL 216 controls the transmission frequency based on the combined signal received from combiner 218. PLL 216 causes RF VCO 212 to generate an appropriate radio frequency signal corresponding to the combined signal provided by combiner 218. The radio frequency signal is output from RF VCO 212 to IQ generation unit 208. In the illustrated embodiment, IQ generation unit 208 is used for receiving, but not transmitting data. Thus, the radio frequency signal output by RF VCO 212 passes through IQ generation unit 208, and is received by mixer 206. Mixer 206 mixes the radio frequency signal received from IQ generation unit 208 with the filtered analog signals received from filter 210, and outputs a mixed signal to driver 204. Driver 204 drives the mixed signal onto antenna 202, thereby causing the mixed signal to be wirelessly transmitted.

Figure 3:
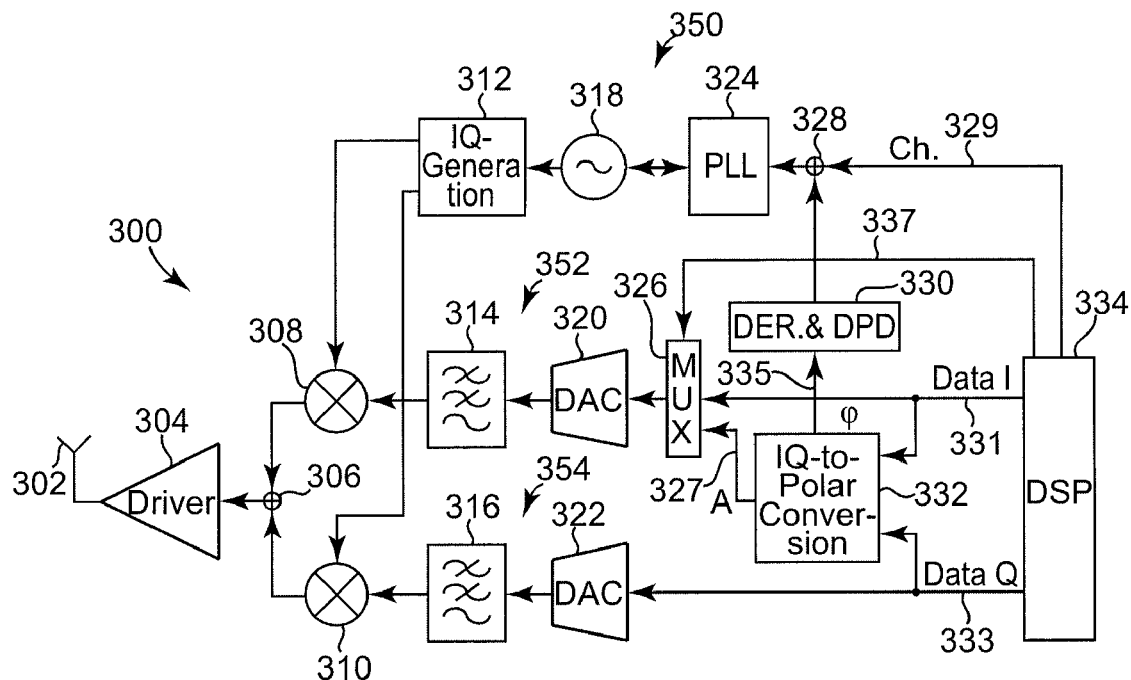
FIG. 3 is a block diagram illustrating a multi-mode IQ and polar modulation transmitter according to one embodiment.

FIG. 3 is a block diagram illustrating a multi-mode IQ and polar modulation transmitter 300 according to one embodiment. In one embodiment, transmitter 300 is configured to be used in a portable electronic device, such as a cellular telephone, with Bluetooth and WLAN capabilities. Transmitter 300 includes antenna 302, driver 304, combiner 306, mixers 308 and 310, IQ generation unit 312, anti-aliasing filters 314 and 316, radio frequency voltage-controlled oscillator (RF VCO) 318, digital-to-analog converters (DACs) 320 and 322, phase locked loop (PLL) 324, multiplexer (MUX) 326, combiner 328, derivative and digital pre-distortion circuit (DER. & DPD) 330, IQ-to-Polar converter 332, and digital signal processor (DSP) 334. Transmitter 300 includes three data paths 350, 352, and 354. The first data path 350 includes PLL 324, RF VCO 318, and IQ generation unit 312. The second data path 352 includes multiplexer 326, DAC 320, filter 314, and mixer 308. The third data path 354 includes DAC 322, filter 316, and mixer 310. In one embodiment, data paths 350, 352, and 354 are analog data paths that process analog signals, or both analog and digital signals. In another embodiment, data paths 350, 352, and 354 are digital data paths that process digital signals.

In one embodiment, transmitter 300 is configured to be selectively operated in either a quadrature (i.e., IQ) modulation mode or a polar modulation mode. In one embodiment, DSP 334 is configured to automatically determine which modulation mode to use based on the type of transmission to be performed or the communication protocol to be used (e.g., Bluetooth or WLAN). In one embodiment, DSP 334 configures transmitter 300 to operate in a quadrature modulation mode when a WLAN transmission is to be performed, and configures transmitter 300 to operate in a polar modulation mode when a Bluetooth transmission is to be performed. The quadrature modulation mode is described first below, followed by a description of the polar modulation mode.

In quadrature modulation mode, DSP 334 provides digital in-phase data (Data I) 331 to multiplexer 326 and IQ-to-Polar converter 332, and provides digital quadrature data (Data Q) 333 to DAC 322 and IQ-to-Polar converter 332. As shown in FIG. 3, multiplexer 326 includes a first input for receiving the digital in-phase data (Data I) 331 for quadrature modulation, and a second input for receiving polar amplitude data (A) 327 for polar modulation. Based on the desired modulation mode (e.g., polar modulation or quadrature modulation), DSP 334 generates a corresponding mode selection signal 337, and outputs the signal 337 to multiplexer 326. The mode selection signal 337 controls which of the two inputs of the multiplexer 326 are connected to the output of the multiplexer 326. For quadrature modulation, the mode selection signal 337 causes the digital in-phase data 331 to be output from the multiplexer 326 to DAC 320.

DAC 320 converts the received digital in-phase data 331 to analog in-phase signals, and outputs the analog signals to filter 314. DAC 322 converts the received digital quadrature data 333 to analog quadrature signals, and outputs the analog signals to filter 316. Filter 314 filters the received analog in-phase signals and outputs filtered analog in-phase signals to mixer 308. Filter 316 filters the received analog quadrature signals and outputs filtered analog quadrature signals to mixer 310.

DSP 334 outputs channel selection data 329 to combiner 328. In one embodiment, circuits 330 and 332 are disabled or not used during the quadrature modulation mode, and no signal is output by circuit 330 to combiner 328. Thus, the channel selection data 329 provided to combiner 328 is not combined with anything, but rather passes through combiner 328 to PLL 324. PLL 324 controls the transmission frequency based on the channel selection data 329 received from DSP 334. PLL 324 causes RF VCO 318 to generate an appropriate analog radio frequency carrier signal corresponding to the selected channel indicated by channel selection data 329.

The analog radio frequency carrier signal is output from RF VCO 318 to IQ generation unit 312, which provides an analog in-phase radio frequency carrier signal to mixer 308 and an analog quadrature radio frequency carrier signal to mixer 310. Mixer 308 mixes the in-phase radio frequency carrier signal received from IQ generation unit 312 with the filtered analog in-phase signals received from filter 314, and outputs a mixed signal to combiner 306. Mixer 310 mixes the quadrature radio frequency carrier signal received from IQ generation unit 312 with the filtered analog quadrature signals received from filter 316, and outputs a mixed signal to combiner 306. Combiner 306 combines the two mixed signals received from mixers 308 and 310, and outputs a combined signal to driver 304. Driver 304 drives the combined signal onto antenna 302, thereby causing the combined signal to be wirelessly transmitted.

In polar modulation mode, DSP 334 provides digital in-phase data (Data I) 331 to multiplexer 326 and IQ-to-Polar converter 332, and provides digital quadrature data (Data Q) 333 to DAC 322 and IQ-to-Polar converter 332. IQ-to-Polar converter 332 converts the received IQ data 331 and 333 to corresponding polar coordinate data, which includes an amplitude component (A) and a phase component ($\phi$). IQ-to-Polar converter 332 outputs the digital amplitude data (A) 327 to multiplexer 326, and outputs the digital phase data ($\phi$) 335 to derivative and digital pre-distortion circuit 330.

For polar modulation, the mode selection signal 337 causes the digital polar amplitude data (A) 327 to be output from the multiplexer 326 to DAC 320. DAC 320 converts the received digital amplitude data 327 to corresponding analog signals, and outputs the analog signals to filter 314. Filter 314 filters the received analog signals and outputs filtered analog signals to mixer 308.

As mentioned above, IQ-to-Polar converter 332 outputs digital phase data ($\phi$) 335 to derivative and digital pre-distortion circuit 330. Circuit 330 performs a derivative function on the received phase data to generate phase difference data (i.e., phase difference between sample clocks, which is equivalent to frequency since frequency equals $d\phi/dt$). Circuit 330 also performs a pre-distortion operation on the received data to compensate for bandwidth limitations of the PLL 324. Circuit 330 outputs the phase difference data to combiner 328. Combiner 328 also receives channel selection data 329 from DSP 334. Combiner 328 combines the channel selection data received from DSP 334 and the phase difference data received from circuit 330, and outputs the combined signal to PLL 324.

PLL 324 controls the transmission frequency based on the combined signal received from combiner 328. PLL 324 causes RF VCO 318 to generate an appropriate analog radio frequency signal corresponding to the combined signal provided by combiner 328. The analog radio frequency signal is output from RF VCO 318 to IQ generation unit 312, which provides corresponding analog radio frequency signals to mixers 308 and 310. Mixer 308 mixes the radio frequency signal received from IQ generation unit 312 with the filtered analog signals received from filter 314, and outputs a mixed signal to combiner 306.

In the illustrated embodiment, mixer 310, filter 316 and/or DAC 322 are disabled or not used in the polar modulation mode, and no signal is output by mixer 310 to combiner 306.

Thus, the mixed signal provided to combiner 306 from mixer 308 is not combined with anything, but rather passes through combiner 306 to driver 304. Driver 304 drives the mixed signal onto antenna 302, thereby causing the mixed signal to be wirelessly transmitted.

Figure 4:
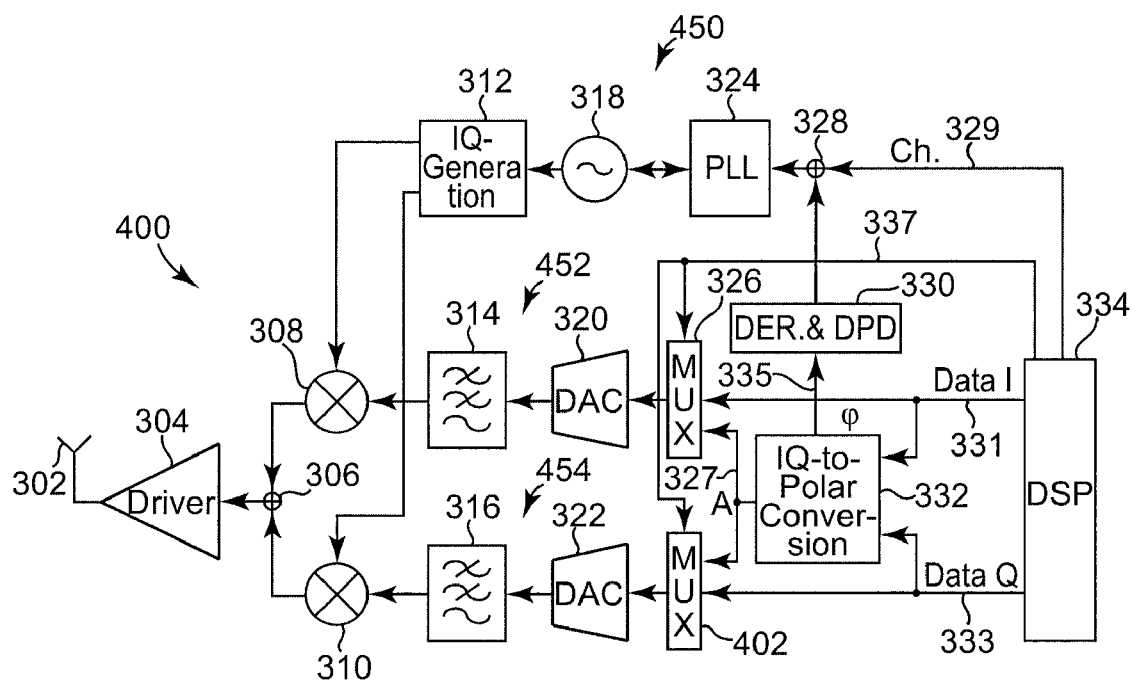
FIG. 4 is a block diagram illustrating a multi-mode IQ and polar modulation transmitter according to another embodiment.

FIG. 4 is a block diagram illustrating a multi-mode IQ and polar modulation transmitter 400 according to another embodiment. In one embodiment, transmitter 400 is configured to be used in a portable electronic device, such as a cellular telephone, with Bluetooth and WLAN capabilities. In the illustrated embodiment, the transmitter 400 includes substantially the same components as the transmitter 300 shown in FIG. 3, but also includes a second multiplexer 402, which is described in further detail below. As shown in FIG. 4, transmitter 400 includes antenna 302, driver 304, combiner 306, mixers 308 and 310, IQ generation unit 312, anti-aliasing filters 314 and 316, radio frequency voltage-controlled oscillator (RF VCO) 318, digital-to-analog converters (DACs) 320 and 322, phase locked loop (PLL) 324, multiplexers (MUXs) 326 and 402, combiner 328, derivative and digital pre-distortion circuit (DER. & DPD) 330, IQ-to-Polar converter 332, and digital signal processor (DSP) 334. Transmitter 400 includes three data paths 450, 452, and 454. The first data path 450 includes PLL 324, RF VCO 318, and IQ generation unit 312. The second data path 452 includes multiplexer 326, DAC 320, filter 314, and mixer 308. The third data path 454 includes multiplexer 402, DAC 322, filter 316, and mixer 310. In one embodiment, data paths 450, 452, and 454 are analog data paths that process analog signals, or both analog and digital signals. In another embodiment, data paths 450, 452, and 454 are digital data paths that process digital signals.

In one embodiment, transmitter 400 is configured to be selectively operated in either a quadrature modulation mode or a polar modulation mode. In one embodiment, DSP 334 is configured to automatically determine which modulation mode to use based on the type of transmission to be performed or the communication protocol to be used (e.g., Bluetooth or WLAN). In one embodiment, DSP 334 configures transmitter 400 to operate in a quadrature modulation mode when a WLAN transmission is to be performed, and configures transmitter 400 to operate in a polar modulation mode when a Bluetooth transmission is to be performed. The quadrature modulation mode is described first below, followed by a description of the polar modulation mode.

In quadrature modulation mode, DSP 334 provides digital in-phase data (Data I) 331 to multiplexer 326 and IQ-to-Polar converter 332, and provides digital quadrature data (Data Q) 333 to multiplexer 402 and IQ-to-Polar converter 332. As shown in FIG. 4, multiplexer 326 includes a first input for receiving the digital in-phase data (Data I) 331 for quadrature modulation, and a second input for receiving polar amplitude data (A) 327 for polar modulation. Multiplexer 402 includes a first input for receiving the digital quadrature data (Data Q) 333 for quadrature modulation, and a second input for receiving polar amplitude data (A) 327 for polar modulation. Based on the desired modulation mode (e.g., polar modulation or quadrature modulation), DSP 334 generates a corresponding mode selection signal 337, and outputs the signal 337 to multiplexers 326 and 402. The mode selection signal 337 controls which of the two inputs of the multiplexers 326 and 402 are connected to the output of the multiplexers. For quadrature modulation, the mode selection signal 337 causes the digital in-phase data 331 to be output from the multiplexer 326 to DAC 320, and causes the digital quadrature data 333 to be output from the multiplexer 402 to DAC 322.

DAC 320 converts the received digital in-phase data 331 to analog in-phase signals, and outputs the analog signals to filter 314. DAC 322 converts the received digital quadrature data 333 to analog quadrature signals, and outputs the analog signals to filter 316. Filter 314 filters the received analog in-phase signals and outputs filtered analog in-phase signals to mixer 308. Filter 316 filters the received analog quadrature signals and outputs filtered analog quadrature signals to mixer 310.

DSP 334 outputs channel selection data 329 to combiner 328. In one embodiment, circuits 330 and 332 are disabled or not used during the quadrature modulation mode, and no signal is output by circuit 330 to combiner 328. Thus, the channel selection data 329 provided to combiner 328 is not combined with anything, but rather passes through combiner 328 to PLL 324. PLL 324 controls the transmission frequency based on the channel selection data 329 received from DSP 334. PLL 324 causes RF VCO 318 to generate an appropriate analog radio frequency carrier signal corresponding to the selected channel indicated by channel selection data 329.

The radio frequency carrier signal is output from RF VCO 318 to IQ generation unit 312, which provides an in-phase radio frequency carrier signal to mixer 308 and a quadrature radio frequency carrier signal to mixer 310. Mixer 308 mixes the in-phase radio frequency carrier signal received from IQ generation unit 312 with the filtered analog in-phase signals received from filter 314, and outputs a mixed signal to combiner 306. Mixer 310 mixes the quadrature radio frequency carrier signal received from IQ generation unit 312 with the filtered analog quadrature signals received from filter 316, and outputs a mixed signal to combiner 306. Combiner 306 combines the two mixed signals received from mixers 308 and 310, and outputs a combined signal to driver 304. Driver 304 drives the combined signal onto antenna 302, thereby causing the combined signal to be wirelessly transmitted.

In polar modulation mode, DSP 334 provides digital in-phase data (Data I) 331 to multiplexer 326 and IQ-to-Polar converter 332, and provides digital quadrature data (Data Q) 333 to multiplexer 402 and IQ-to-Polar converter 332. IQ-to-Polar converter 332 converts the received IQ data 331 and 333 to corresponding polar coordinate data, which includes an amplitude component (A) and a phase component (φ). IQ-to-Polar converter 332 outputs the digital amplitude data (A) 327 to multiplexers 326 and 402, and outputs the digital phase data (φ) 335 to derivative and digital pre-distortion circuit 330.

For polar modulation, the mode selection signal 337 causes the digital polar amplitude data (A) 327 to be output from the multiplexer 326 to DAC 320 and from the multiplexer 402 to DAC 322. DACs 320 and 322 convert the received digital amplitude data 327 to corresponding analog signals, and output the analog signals to filters 314 and 316, respectively. Filters 314 and 316 filter the received analog signals and output filtered analog signals to mixers 308 and 310, respectively.

As mentioned above, IQ-to-Polar converter 332 outputs digital phase data (φ) 335 to derivative and digital pre-distortion circuit 330. Circuit 330 performs a derivative function on the received phase data to generate phase difference data (i.e., phase difference between sample clocks, which is equivalent to frequency since frequency equals dφ/dt). Circuit 330 also performs a pre-distortion operation on the received data to compensate for bandwidth limitations of the PLL 324. Circuit 330 outputs the phase difference data to combiner 328. Combiner 328 also receives channel selection data 329 from DSP 334. Combiner 328 combines the channel selection data received from DSP 334 and the phase difference data received from circuit 330, and outputs the combined signal to PLL 324.

PLL 324 controls the transmission frequency based on the combined signal received from combiner 328. PLL 324 causes RF VCO 318 to generate an appropriate analog radio frequency signal corresponding to the combined signal provided by combiner 328. The analog radio frequency signal is output from RF VCO 318 to IQ generation unit 312, which provides corresponding analog radio frequency signals to mixers 308 and 310. In embodiments, the analog radio frequency signals provided to mixers 308 and 310 are in phase. In embodiments, the analog radio frequency signals provided to mixers 308 and 310 are the same signal, i.e. having the same phase and amplitude. Mixer 308 mixes the radio frequency signal received from IQ generation unit 312 with the filtered analog signals received from filter 314, and outputs a mixed signal to combiner 306. Mixer 310 mixes the radio frequency signal received from IQ generation unit 312 with the filtered analog signals received from filter 316, and outputs a mixed signal to combiner 306. Combiner 306 combines the mixed signals received from mixers 308 and 310, and outputs a combined signal to driver 304. Driver 304 drives the combined signal onto antenna 302, thereby causing the combined signal to be wirelessly transmitted.

In one embodiment of transmitters 300 and 400, in the quadrature modulation mode, the radio frequency signal output by IQ generation unit 312 to mixer 308 has a zero degree phase shift, and the radio frequency signal output by IQ generation unit 312 to mixer 310 has a ninety degree phase shift. In contrast, in the polar modulation mode according to one embodiment, the radio frequency signals output by IQ generation unit 312 to mixers 308 and 310 both have a zero degree phase shift (i.e., the two signals are in phase with each other).

In one embodiment, transmitter 400 is capable of producing more output power than transmitter 300. In the polar modulation mode, the multiplexers 326 and 402 are switched in parallel, and the polar amplitude data 327 is switched onto two data paths 452 and 454, as opposed to the one path 352 used by the illustrated embodiment of transmitter 300. In one embodiment, this parallel switching of the multiplexers 326 and 402 and the use of two data paths 452 and 454 produces twice as much output power as provided by transmitter 300, and reduces parasitic capacitance issues that can occur from an unused data path. In another embodiment, the data paths 452 and 454 may be designed to occupy less area in the device, and still produce the same amount of output power as transmitter 300, or some other desired level of output power. The data paths 452 and 454 should be matched to minimize any timing differences. Since such matching is normally done anyway for an IQ modulator, there is no additional effort needed to add polar modulation functionality.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A multi-mode modulator, comprising:
 a first data path to process in-phase signals in a quadrature modulation mode, the first data path comprising a first input capable to receive digital in phase data and a first output to output analog signals;

a second data path to process quadrature signals during the quadrature modulation mode, the second data path comprising a second input capable to receive digital quadrature data and a second output to output analog signals;

a quadrature-to-polar converter to convert the digital in-phase data and digital quadrature data to digital polar amplitude data and digital polar phase data; and a first multiplexer to selectively switch polar amplitude data onto one of the first and second data paths in response to a selection signal.

2. The multi-mode modulator of claim 1, wherein the first multiplexer includes a first input to receive the digital polar amplitude data and a second input to receive one of the digital in-phase data and digital quadrature data.

3. The multi-mode modulator of claim 2, and further comprising:

a digital-to-analog converter having an input coupled to an output of the first multiplexer, and having an output coupled to one of the first and second data paths.

4. The multi-mode modulator of claim 3, wherein the first and second data paths each include an analog filter and an analog mixer.

5. The multi-mode modulator of claim 4, and further comprising a third data path to generate transmit frequency signals that are provided to the mixers of the first and the second data paths.

6. The multi-mode modulator of claim 5, wherein the third data path includes a phase locked loop and a voltage-controlled oscillator.

7. The multi-mode modulator of claim 5, wherein the digital polar phase data is provided as an input to the third data path during a polar modulation mode.

8. The multi-mode modulator of claim 5, wherein the third data path includes a channel selection input to select a transmission frequency.

9. The multi-mode modulator of claim 1, wherein a modulation mode of the modulator is automatically controlled based on a communication protocol to be used for transmission of data.

10. The multi-mode modulator of claim 9, wherein the modulator operates in a polar modulation mode for Bluetooth transmissions, and operates in the quadrature modulation mode for wireless LAN (WLAN) transmissions.

11. The multi-mode modulator of claim 1, wherein the first multiplexer selectively switches the polar amplitude data onto the first data path in response to a selection signal, and wherein the modulator further comprises:

a second multiplexer to selectively switch the polar amplitude data onto the second data path in response to the selection signal.

12. The multi-mode modulator of claim 11, further comprising a third data path to generate transmit frequency signals that are provided to a mixer of the first data path and a mixer of the second data path, the third data path being capable to provide during a polar modulation mode the transmit frequency signals to the mixer of the first data path in phase with the transmit frequency signals provided to the mixer of the second data path.

13. A method of modulating data, the method comprising:

processing in-phase signals during a quadrature modulation mode in a first data path, the first data path comprising a first input capable to receive digital in phase data and a first output to output analog signals;

processing quadrature signals during the quadrature modulation mode in a second data path, the second data path comprising a second input capable to receive digital quadrature data and a second output to output analog signals;

generating a modulation mode selection signal based on a communication protocol to be used for transmission of data;

converting the digital in-phase data and digital quadrature data to digital polar amplitude data and digital polar phase data; and switching polar amplitude data onto one of the first and second data paths when the modulation mode selection signal indicates selection of a polar modulation mode.

14. The method of claim 13, and further comprising:

switching polar amplitude data onto both of the first and second data paths when the modulation mode selection signal indicates selection of a polar modulation mode.

15. The method of claim 13, and further comprising:

generating a modulation mode selection signal that causes selection of a polar modulation mode for Bluetooth transmissions, and that causes selection of a quadrature modulation mode for wireless LAN (WLAN) transmissions.

16. A multi-mode modulation transmitter, comprising:

a first data path for processing in-phase signals in a quadrature modulation mode, the first data path comprising a first input capable to receive digital in-phase data and a second output to output analog signals;

a second data path for processing quadrature signals during the quadrature modulation mode, the second data path comprising a second input capable to receive digital quadrature data and a second output to output analog signals;

means for converting in-phase data and quadrature data to polar amplitude data and polar phase data;

means for switching the polar amplitude data onto at least one of the first and second data paths in response to selection of a polar modulation mode; and transmission means coupled to the first and second data paths for wirelessly transmitting data.

17. The transmitter of claim 16, wherein the first and second data paths each include means for filtering analog signals and means for mixing analog signals.

18. The transmitter of claim 17, and further comprising a third data path for generating analog transmit frequency signals that are provided to the means for mixing analog signals of the first and the second data paths.

19. The transmitter of claim 18, wherein the polar phase data is provided as an input to the third data path during the polar modulation mode.

20. The transmitter of claim 16, wherein a modulation mode of the transmitter is automatically controlled based on a communication protocol to be used for the transmission of data.

21. The transmitter of claim 20, wherein the transmitter operates in the polar modulation mode for Bluetooth transmissions, and operates in the quadrature modulation mode for wireless LAN (WLAN) transmissions.

22. The transmitter of claim 16, wherein the means for switching is configured to switch the polar amplitude data onto both of the first and second data paths in response to selection of the polar modulation mode.

23. A multi-mode modulator, comprising:

a first data path to process in-phase signals in a quadrature modulation mode, the first data path comprising a first mixer;

a second data path to process quadrature signals during the quadrature modulation mode, the second data path comprising a second mixer;

at least one multiplexer to selectively switch polar amplitude data onto both of the first and second data paths in response to a selection signal; and a third data path to generate transmit frequency signals that are provided to the first and second mixers, the third data path capable to provide during a polar modulation mode the transmit frequency signals to the first mixer in phase with the transmit frequency signals to the second mixer.

24. The multi-mode modulator of claim 23, wherein the third data path is capable to provide during the quadrature modulation mode the transmit frequency signals to the first mixer with a phase shift of 180° with respect to the transmit frequency signals to the second mixer.

25. The multi-mode modulator of claim 23, and further comprising:

a first input to receive digital in-phase data;

a second input to receive digital quadrature data; and a quadrature-to-polar converter to convert the digital in-phase data and digital quadrature data to digital polar amplitude data and digital polar phase data.

26. The multi-mode modulator of claim 25, wherein the at least one multiplexer includes a first multiplexer having a first input to receive the digital polar amplitude data and a second input to receive the digital in-phase data.

27. The multi-mode modulator of claim 26, wherein the first multiplexer selectively switches the digital polar amplitude data onto the first data path in response to the selection signal.

28. The multi-mode modulator of claim 27, wherein the at least one multiplexer includes a second multiplexer having a first input to receive the digital polar amplitude data and a second input to receive the digital in-phase data.

29. The multi-mode modulator of claim 28, wherein the second multiplexer selectively switches the digital polar amplitude data onto the second data path in response to the selection signal.

30. The multi-mode modulator of claim 23, and further comprising a third data path to generate transmit frequency signals that are provided to mixers of the first and the second data paths.

31. The multi-mode modulator of claim 23, wherein the modulator operates in a polar modulation mode for Bluetooth transmissions, and operates in the quadrature modulation mode for wireless LAN (WLAN) transmissions.

32. A multi-mode modulator, comprising:

a first data path to process in-phase signals in a quadrature modulation mode, the first data path comprising a first input capable to receive digital in phase data and a first output to output analog signals;

a second data path to process quadrature signals during the quadrature modulation mode, the second data path comprising a second input capable to receive digital quadrature data and a second output to output analog signals;

a first multiplexer to selectively switch polar amplitude data onto the first data path in response to a selection signal; and a second multiplexer to selectively switch the polar amplitude data onto the second data path in response to the selection signal.

* * * * *